US012614592B2

(12) United States Patent
Taira et al.

(10) Patent No.: US 12,614,592 B2
(45) Date of Patent: Apr. 28, 2026

(54) INFORMATION PROCESSING APPARATUS AND CONTROL METHOD FOR STORING MULTI-BIT DATA WITH CHANGEABLE VARIATION WIDTH

(71) Applicant: Lenovo (Singapore) Pte. Ltd., Singapore (SG)

(72) Inventors: Yusuke Taira, Kanagawa (JP); Takashi Sugawara, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 9 days.

(21) Appl. No.: 18/756,223

(22) Filed: Jun. 27, 2024

(65) Prior Publication Data

US 2025/0022514 A1    Jan. 16, 2025

(30) Foreign Application Priority Data

Jul. 13, 2023    (JP) ................................. 2023-115225

(51) Int. Cl.
*G06F 12/00* (2006.01)
*G06F 12/02* (2006.01)
*G11C 16/10* (2006.01)

(52) U.S. Cl.
CPC .......... *G11C 16/10* (2013.01); *G06F 12/0246* (2013.01)

(58) Field of Classification Search
CPC ... G11C 16/10; G11C 11/5628; G11C 16/349; G11C 16/12; G11C 16/26; G11C 16/30; G11C 16/3404; G06F 12/0246

USPC ......................................................... 711/103
See application file for complete search history.

(56) References Cited

U.S. PATENT DOCUMENTS

| | | | |
|---|---|---|---|
| 2016/0216910 A1* | 7/2016 | Phan ..................... | G06F 3/0604 |
| 2022/0291863 A1* | 9/2022 | Bae ......................... | G06F 1/06 |
| 2022/0374216 A1* | 11/2022 | Sugawara ............. | G06F 3/0604 |

FOREIGN PATENT DOCUMENTS

| | | |
|---|---|---|
| JP | H10-106276 A | 4/1998 |
| JP | 2002-049535 A | 2/2002 |
| JP | 2004-94987 A | 3/2004 |
| JP | 2007-35092 A | 2/2007 |
| JP | 2020-30875 A | 2/2020 |
| JP | 2020154674 A | 9/2020 |
| KR | 101772577 B1 * | 8/2017 |

* cited by examiner

*Primary Examiner* — Mardochee Chery

(74) *Attorney, Agent, or Firm* — Osha Bergman Watanabe & Burton LLP

(57) ABSTRACT

An information processing apparatus includes: a solid state drive (SSD) configured with a multi-bit cell for storing multi-bit data in one memory cell and configured to include an electrically rewritable non-volatile storage unit; and a main control unit configured to execute processing based on data stored in the SSD. The SSD includes a storage control unit, which is a storage control unit configured to control access to the non-volatile storage unit, and configured to execute a storage process through which a variation width of a threshold voltage is changeable when the multi-bit data is stored in the multi-bit cell.

7 Claims, 5 Drawing Sheets

INFORMATION PROCESSING APPARATUS AND CONTROL METHOD FOR STORING MULTI-BIT DATA WITH CHANGEABLE VARIATION WIDTH

CROSS-REFERENCE TO RELATED APPLICATIONS

This application claims priority to Japanese Patent Application No. 2023-115225 filed on Jul. 13, 2023, the contents of which are hereby incorporated herein by reference in their entirety.

TECHNICAL FIELD

The present invention relates to an information processing apparatus and a control method.

BACKGROUND

In an information processing apparatus such as a personal computer, in recent years, storage devices equipped with solid state drives (SSDs) instead of hard disk drives (HDDs) have become popular (see, for example, Japanese Unexamined Patent Application Publication No. 2020-154674). In addition, in order to increase capacity, for example, some SSDs are known to include flash memories that use memory cells (hereinafter, referred to as multi-bit cells) that can store data equivalent to multiple bits in one memory cell, such as multiple level cell (MLC), triple level cell (TLC), and quad level cell (QLC).

Meanwhile, in the information processing apparatus in the related art, although the capacity of the SSD can be increased by using the multi-bit cells, there is a tendency that a data retention (a data retention period) is shortened. In addition, in the information processing apparatus in the related art, for example, even when the information processing apparatus reaches an end of life (EOL) due to replacement with a new information processing apparatus or the like, there may be a demand for a guarantee of reading the data of the SSD for a certain period. However, in the information processing apparatus in the related art, there is a possibility that the reading of the data of the SSD for a certain period cannot be guaranteed, for example, in a state in which power is not supplied, such as after reaching EOL, while using the multi-bit cell.

SUMMARY

One or more embodiments of the present invention provide an information processing apparatus and a control method capable of reducing data corruption of an SSD in a state in which power is not supplied and guaranteeing reading of data of the SSD for a certain period.

An information processing apparatus according to one or more embodiments of the present invention includes: a solid state drive (SSD) configured with a multi-bit cell for storing multi-bit data in one memory cell and configured to include an electrically rewritable non-volatile storage unit; and a main control unit configured to execute processing based on data stored in the SSD, in which the SSD includes a storage control unit, which is a storage control unit configured to control access to the non-volatile storage unit, and configured to execute a storage process through which a variation width of a threshold voltage is changeable when the multi-bit data is stored in the multi-bit cell.

In addition, in the information processing apparatus according to one or more embodiments of the present invention, the storage control unit may be configured to store the multi-bit data such that the variation width of the threshold voltage is narrower for a specific area, which is set by the main control unit, than for other areas, among storage areas of the non-volatile storage unit.

In addition, in the information processing apparatus according to one or more embodiments of the present invention, the SSD may include a position information storage unit configured to store logical position information on the specific area in the non-volatile storage unit, and the storage control unit may be configured to determine, when data is stored in a designated logical position that is a logical position designated by the main control unit, whether or not the designated logical position is the specific area based on the logical position information stored in the position information storage unit and store, when the designated logical position is the specific area, the data in the designated logical position with a high-quality storage mode in which the variation width of the threshold voltage is narrower than in a normal storage mode.

In addition, in the information processing apparatus according to one or more embodiments of the present invention, the storage control unit may be configured to execute, when the designated logical position is not the specific area, in the normal storage mode, the storage process in which the variation width of the threshold voltage is wider than in the high-quality storage mode, and a storage period, which is a period required for storage in the multi-bit cell, is shorter than in the high-quality storage mode.

In addition, in the information processing apparatus according to one or more embodiments of the present invention, the storage control unit may be configured to execute, in the high-quality storage mode, an application process of applying a voltage for storing the data to the multi-bit cell for a predetermined period obtained by dividing an application period, a checking process of checking whether or not the threshold voltage falls within the variation width of the threshold voltage, after the application process is performed, and a repeating process of repeating the application process and the checking process until the threshold voltage falls within the variation width of the threshold voltage.

In addition, in the information processing apparatus according to one or more embodiments of the present invention, when the information processing apparatus reaches end of life (EOL), the main control unit may be configured to set the specific area in the non-volatile storage unit and store important data, which needs to be read at a later date, in the specific area.

In the information processing apparatus, a control method according to one or more embodiments of the present invention is a control method of the information processing apparatus including a solid state drive (SSD) configured with a multi-bit cell for storing multi-bit data in one memory cell and configured to include an electrically rewritable non-volatile storage unit, and a main control unit configured to execute processing based on data stored in the SSD, the control method includes: a step of causing a storage control unit of the SSD to control access to the non-volatile storage unit, which is a step of executing a storage process through which a variation width of a threshold voltage is changeable when the multi-bit data is stored in the multi-bit cell.

The above-described aspects of present invention can reduce data corruption of an SSD in a state in which power is not supplied and guarantee the reading of the data of the SSD for a certain period.

DETAILED DESCRIPTION

Hereinafter, an information processing apparatus and a control method according to embodiments of the present invention will be described with reference to the accompanying drawings.

Figure 1:
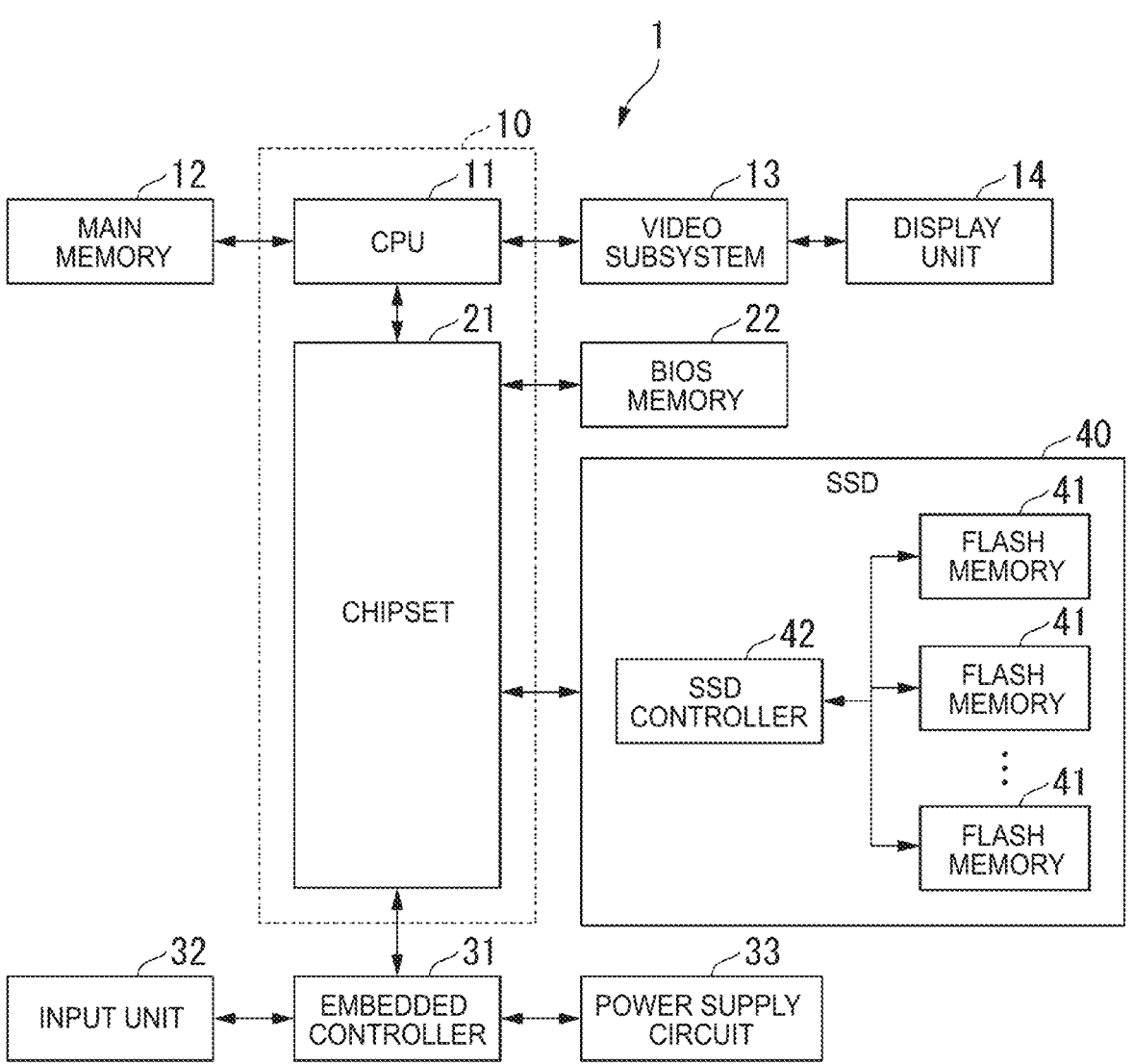
FIG. 1 is a diagram illustrating an example of main hardware configurations of an information processing apparatus and an SSD according to one or more embodiments.

FIG. 1 is a diagram illustrating an example of a main hardware configuration of the information processing apparatus 1 and an SSD 40 according to one or more embodiments.

As illustrated in FIG. 1, the information processing apparatus 1 is, for example, a laptop personal computer, and includes a CPU 11, a main memory 12, a video subsystem 13, a display unit 14, a chipset 21, a BIOS memory 22, an embedded controller 31, an input unit 32, a power supply circuit 33, and the SSD 40.

The central processing unit (CPU) 11 executes various types of arithmetic processing under program control and controls the entire information processing apparatus 1.

The main memory 12 is a writable memory used as a read area for an execution program of the CPU 11 or as a work area for writing processing data of the execution program. The main memory 12 is configured with, for example, a plurality of dynamic random access memory (DRAM) chips. The execution program includes an operating system (OS), various drivers for operating the hardware of peripheral devices, various services/utilities, application programs, and the like.

The video subsystem 13 is a subsystem for realizing a function related to image display and includes a video controller. The video controller processes a drawing instruction from the CPU 11, writes the processed drawing information to the video memory, reads the drawing information from the video memory, and outputs the drawing information as drawing data (display data) to the display unit 14.

The display unit 14 is, for example, a liquid crystal display and displays a display screen based on the drawing data (display data) output from the video subsystem 13.

The chipset 21 includes controllers, such as a universal serial bus (USB), a serial AT attachment (ATA), a serial peripheral interface (SPI) bus, a peripheral component interconnect (PCI) bus, a PCI-Express bus, and a low pin count (LPC) bus, and is connected to a plurality of devices. In FIG. 1, as an example of the device, the BIOS memory 22 and the SSD 40 are connected to the chipset 21. It should be noted that, in one or more embodiments, the CPU 11 and the chipset 21 correspond to a main control unit 10.

The basic input output system (BIOS) memory 22 is configured with, for example, an electrically rewritable non-volatile memory such as an electrically erasable programmable read only memory (EEPROM) or a flash ROM (flash memory). The BIOS memory 22 stores, for example, a BIOS, a system firmware for controlling the embedded controller 31, and the like.

The embedded controller 31 is a one-chip microcomputer that monitors and controls various devices (peripheral devices, sensors, or the like) regardless of a system state of the information processing apparatus 1. In addition, the embedded controller 31 has a power management function of controlling the power supply circuit 33. It should be noted that the embedded controller 31 is configured with a CPU, a ROM, a RAM, and the like (not illustrated), and also includes a plurality of channels of A/D input terminals, D/A output terminals, timers, and digital input/output terminals. For example, the input unit 32, the power supply circuit 33, and the like are connected to the embedded controller 31 via the input/output terminals, and the embedded controller 31 controls the operations of the input unit 32, the power supply circuit 33, and the like.

The input unit 32 is, for example, an input device such as a keyboard or a pointing device such as a touch pad.

The power supply circuit 33 includes, for example, a DC/DC converter, a charge/discharge unit, an AC/DC adapter, and the like, and converts a direct current voltage, which is supplied from an external power or a battery via, for example, the AC/DC adapter, into a plurality of voltages required to operate the information processing apparatus 1. In addition, the power supply circuit 33 supplies electric power to each unit of the information processing apparatus 1 based on the control from the embedded controller 31.

The solid state drive (SSD) 40 is a memory drive device including a rewriteable non-volatile memory and stores an OS, various drivers, various services/utilities, an application program, and various types of data. The information processing apparatus 1 executes various types of information processing by using the data stored in the SSD 40. The SSD 40 is connected to the chipset 21 through, for example, a serial ATA or a PCI-Express bus.

In addition, the SSD 40 includes a plurality of flash memories 41 and an SSD controller 42.

The flash memory 41 is, for example, a NAND flash memory. The flash memory 41 includes, for example, a charge trap type memory cell that stores data by trapping electrons in a charge trap layer or the like without including a floating gate type memory cell and a floating gate. In addition, a memory cell of the flash memory 41 is a multi-bit cell that stores multi-bit data in one memory cell, such as a multiple level cell (MLC), a triple level cell (TLC), a quad level cell (QLC), or the like, for example. Here, the multi-bit cell is a memory cell capable of storing data having a plurality of bits in one memory cell by setting a plurality of data write thresholds.

The SSD controller 42 is, for example, a processor including a CPU, a ROM, a RAM, and the like (not illustrated), and comprehensively controls the SSD 40. The SSD controller 42 executes, for example, processing of a control process of a host interface (host I/F) with the chipset 21, a control process of a memory interface (memory I/F) with the flash memory 41, a data management process of the flash memory 41, and the like.

The SSD controller 42 controls, for example, a storage process of storing data in the multi-bit cell (a write process of writing the data) and a read process of reading the data from the multi-bit cell.

Next, a functional configuration of the information processing apparatus 1 according to one or more embodiments will be described with reference to FIG. 2.

Figure 2:
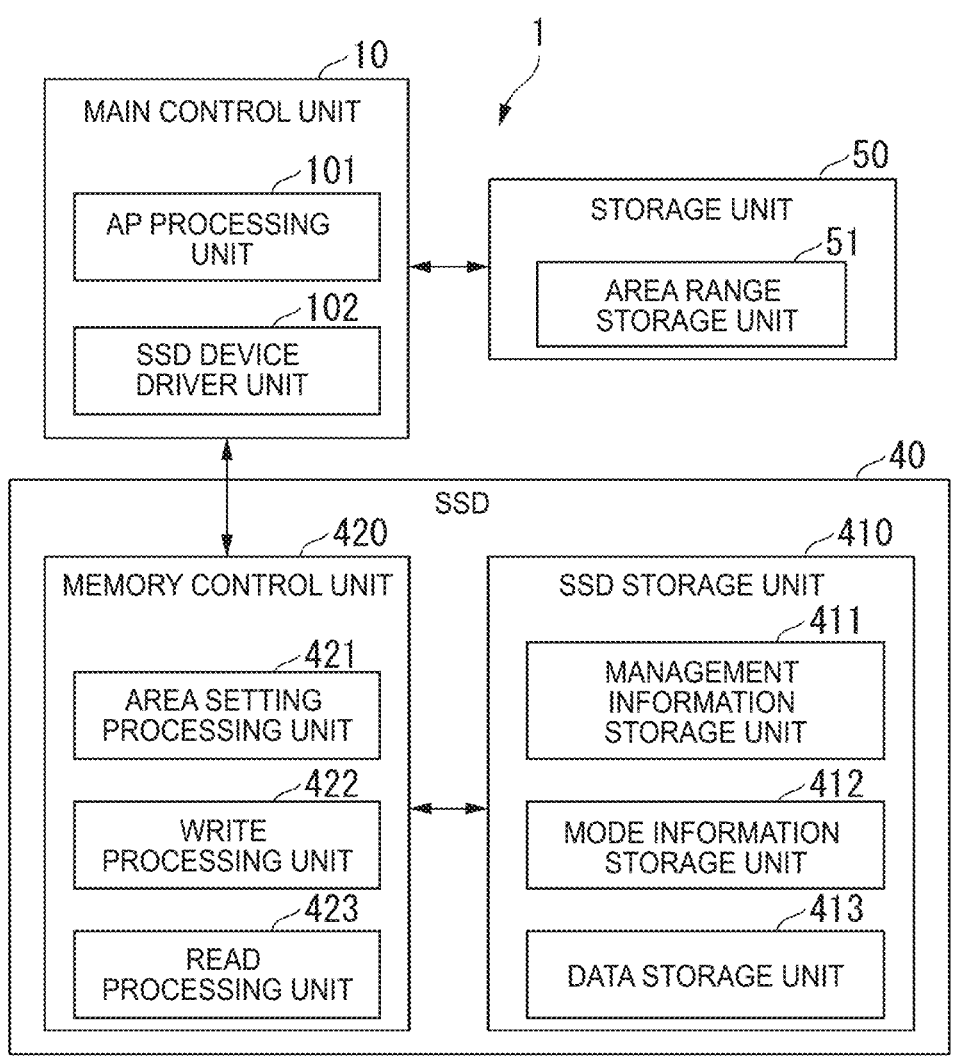
FIG. 2 is a functional block diagram illustrating an example of a functional configuration of the information processing apparatus according to one or more embodiments.

FIG. 2 is a functional block diagram illustrating an example of a functional configuration of the information processing apparatus 1 according to one or more embodiments.

As illustrated in FIG. 2, the information processing apparatus 1 includes the main control unit 10, the SSD 40, and a storage unit 50. In addition, the SSD 40 includes an SSD storage unit 410 and a memory control unit 420.

The SSD storage unit 410 is, for example, a storage unit realized by the flash memory 41 of the SSD 40 and includes a management information storage unit 411, a mode information storage unit 412, and a data storage unit 413.

The management information storage unit 411 is, for example, a storage unit realized by the flash memory 41 and stores the management information of the SSD 40. The management information storage unit 411 stores, for example, conversion table information between a physical address of the flash memory 41 and a logical address (for example, LBA: logical block addressing (logical position information)), the management information of a free area and a used area of the flash memory 41, area range information (LBA information (logical position information) of a persistent partition) indicating a range of a persistent partition area, which will be described later, and the like.

The mode information storage unit 412 is, for example, a storage unit realized by the flash memory 41 and stores write control information of a normal storage mode (normal write mode) and a high-quality storage mode (high-quality write mode), which will be described later. The write control information includes, for example, an application period (application time) of a divided write voltage, a variation range (allowable range) of Vth, and the like.

The normal storage mode is a mode in which the variation range (allowable range) of Vth is wider than in the high-quality storage mode and the write time required for writing is shorter than in the high-quality storage mode. In addition, the high-quality storage mode is a mode in which the variation range (allowable range) of Vth is narrower than in the normal storage mode and the write time required for writing is longer than in the normal storage mode.

The data storage unit 413 is, for example, a storage unit realized by the flash memory 41 and stores various types of data. The data storage unit 413 stores various types of data of the information processing apparatus 1, for example. Here, a data area of the data storage unit 413 will be described with reference to FIG. 3.

Figure 3:
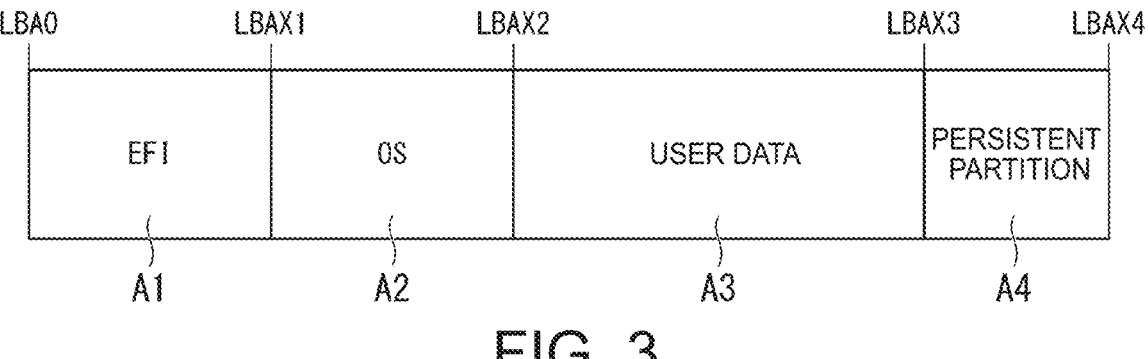
FIG. 3 is a diagram illustrating an example of an area of the SSD of the information processing apparatus according to one or more embodiments.

FIG. 3 is a diagram illustrating an example of an area of the SSD 40 of the information processing apparatus 1 according to one or more embodiments. In the example illustrated in FIG. 3, the data storage unit 413 is allocated to an extensible firmware interface (EFI) area, an OS area, a user data area, and a persistent partition.

The EFI area is an area A1 for storing a program of EFI. In addition, the OS area is, for example, an area A2 for storing an OS program such as Windows (registered trademark). In addition, the user data area is an area A3 for storing various programs or various types of data processed on the OS.

In addition, a persistent partition is, for example, an area A4 that is set when the information processing apparatus 1 reaches EOL and is a data area for storing important data that needs to be read at a later date. The persistent partition is an example of a specific area and is set by a main control unit, which will be described later.

Each area of the data storage unit 413 is accessible from the main control unit 10 by using a logical block address (LBA). In the example illustrated in FIG. 3, the area A1 from LBA0 to LBAX1 is the EFI area, and the area A2 from LBAX1 to LBAX2 is the OS area. In addition, the area A3 from the LBX2 to the LBAX3 is the user data area, and the area A4 from the LBAX3 to the LBAX4 is the persistent partition (specific area).

Returning to the description of FIG. 2, the memory control unit 420 (an example of a storage control unit) is a functional unit realized by, for example, causing a CPU (not illustrated) of the SSD controller 42 to execute a program stored in a ROM (not illustrated). The memory control unit 420 controls the access to the SSD storage unit 410.

The memory control unit 420 executes, for example, the storage process through which the variation width of Vth (threshold voltage) is changeable when the multi-bit data is stored in the multi-bit cell of the SSD storage unit 410. The memory control unit 420 stores the multi-bit data such that the variation width of Vth is narrower for the persistent partition (specific area), which is set by the main control unit 10, than for other areas, among the storage areas of the SSD storage unit 410.

The memory control unit 420 includes an area setting processing unit 421, a write processing unit 422, and a read processing unit 423.

The area setting processing unit 421 sets various partitions (storage areas) in response to a request from the main control unit 10. The area setting processing unit 421 stores the set partition (storage area) in the management information storage unit 411. The area setting processing unit 421 sets, for example, the persistent partition (specific area) in response to the request from the main control unit 10 and stores the area range information of the persistent partition (range information of the LBA) in the management information storage unit 411.

The write processing unit 422 executes the storage process (write process) of data in the multi-bit cell of the SSD storage unit 410. The write processing unit 422 executes the storage process (write process) of changing the variation range of Vth and the write time required for writing based on the setting information for each mode stored in the mode information storage unit 412. The write processing unit 422 has the normal storage mode and the high-quality storage mode. The write processing unit 422 executes the storage process in the high-quality storage mode with respect to the above-described persistent partition (specific area) and executes the storage process in the normal storage mode with respect to the other areas (for example, a user data area and the like).

The write processing unit 422 determines whether or not the designated LBA is a persistent partition based on the LBA information stored in the management information storage unit 411 in a case of storing the data in the designated LBA, which is the LBA designated by the main control unit 10. The write processing unit 422 stores the data in the designated LBA in a high-quality storage mode, when the designated LBA is the persistent partition (specific area). In addition, when the designated LBA is not the persistent partition (specific area), the write processing unit 422 stores the data in the designated LBA in the normal storage mode.

The write processing unit 422 executes an application process of applying a voltage for storing data in the multi-bit cell for a predetermined period obtained by dividing the application period in the high-quality storage mode and executes a checking process of checking whether or not Vth falls within the variation width of Vth after the application process is performed. The write processing unit 422 executes a repeating process of repeating the application process and the checking process until Vth falls within the variation width of Vth in the high-quality storage mode.

The read processing unit 423 reads the data of the designated LBA, which is designated from the main control unit 10, based on the management information stored in the management information storage unit 411 and outputs the data to the main control unit 10.

Next, a difference in storage process to the multi-bit cell between the above-described normal storage mode and a high-quality storage mode will be described with reference to FIGS. 4 and 5.

Figures 4, 5:
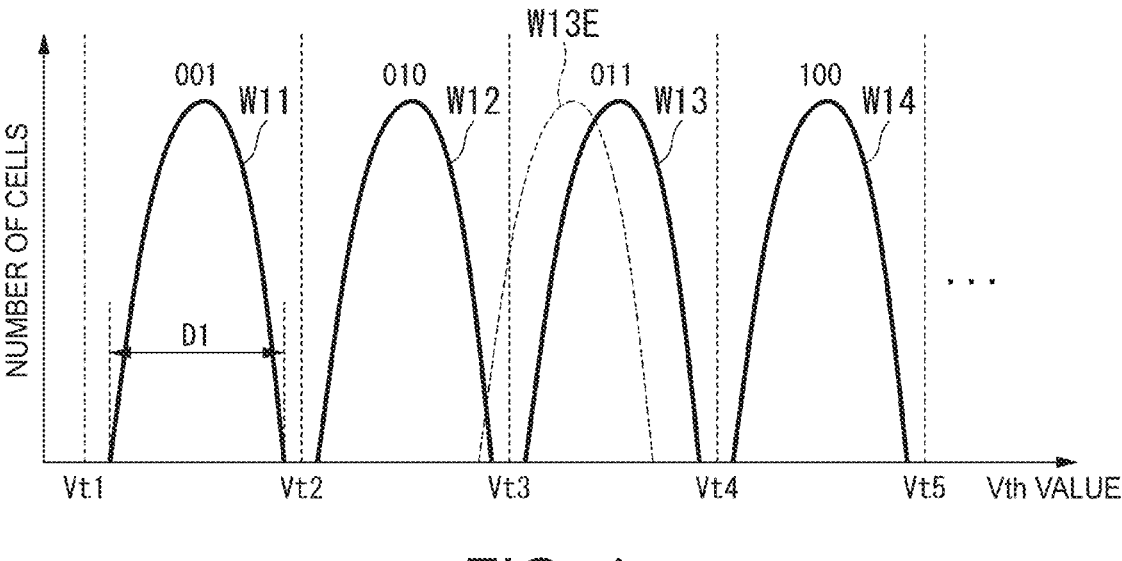
FIG. 4 is a diagram illustrating a distribution example of Vth in a normal storage mode of the SSD of the information processing apparatus according to one or more embodiments.
FIG. 5 is a diagram illustrating a distribution example of Vth in a high-quality storage mode of the SSD of the information processing apparatus according to one or more embodiments.

FIG. 4 is a diagram illustrating a distribution example of Vth in the normal storage mode of the SSD 40 of the information processing apparatus 1 according to one or more embodiments.

In FIG. 4, a horizontal axis of a graph indicates Vth when the storage process (write process) is performed on each data in the normal storage mode, and a vertical axis indicates number of cells. In addition, in FIG. 4, a waveform W11 shows a Vth distribution when data "001" is stored in the multi-bit cell in the normal storage mode, and a waveform W12 shows a Vth distribution when data "010" is stored in the multi-bit cell in the normal storage mode. In addition, a waveform W13 shows a Vth distribution when the data "011" is stored in the multi-bit cell in the normal storage mode, and a waveform W14 shows a Vth distribution when the data "100" is stored in the multi-bit cell in the normal storage mode.

The write processing unit 422 executes the storage process of the data with a distribution having a variation width D1 of Vth as shown in the waveform W11 to the waveform W14 in FIG. 4 according to the write data (storage data), in the normal storage mode.

In addition, when the data is read from the multi-bit cell, the read processing unit 423 determines that the data is "001" when the Vth is between the voltage Vt1 and the voltage Vt2 and determines that the data is "010" when the Vth is between the voltage Vt2 and the voltage Vt3. In addition, when the data is read from the multi-bit cell, the read processing unit 423 determines that the data is "011" when the Vth is between the voltage Vt3 and the voltage Vt4 and determines that the data is "100" when the Vth is between the voltage Vt4 and the voltage Vt5.

In addition, a waveform W13E shows an example in which Vth is moved to a lower side due to deterioration of the multi-bit cell or the elapse of time from the data writing. In this case, in some of the multi-bit cells, since Vth is lower than the voltage Vt3, data corruption occurs.

FIG. 5 is a diagram illustrating a distribution example of Vth in the high-quality storage mode of the SSD 40 of the information processing apparatus 1 according to one or more embodiments.

In FIG. 5, a horizontal axis of a graph indicates Vth when the storage process (write process) is performed on each data in the high-quality storage mode, and a vertical axis indicates the number of cells. In addition, in FIG. 5, a waveform W21 shows a Vth distribution when data "001" is stored in the multi-bit cell in the high-quality storage mode, and a waveform W22 shows a Vth distribution when data "010" is stored in the multi-bit cell in the high-quality storage mode. In addition, a waveform W23 shows a Vth distribution when the data "011" is stored in the multi-bit cell in the high-quality storage mode, and a waveform W24 shows a Vth distribution when the data "100" is stored in the multi-bit cell in the high-quality storage mode.

The write processing unit 422 executes the storage process of the data with a distribution having a variation width D2 of Vth as shown in the waveform W21 to the waveform W24 in FIG. 5 according to the write data (storage data), in the high-quality storage mode. It should be noted that the variation width D2 of Vth in the high-quality storage mode is narrower than the variation width D1 of Vth in the normal storage mode.

Returning to the description of FIG. 2 again, the storage unit 50 is, for example, a storage unit realized by the main memory 12 or the SSD 40, and stores various types of information used by the information processing apparatus 1. The storage unit 50 includes an area range storage unit 51.

The area range storage unit 51 is, for example, a storage unit realized by the main memory 12 and stores information indicating a range of the LBA of the persistent partition (specific area) described above.

The main control unit 10 is a functional unit realized by the CPU 11 and the chipset 21 executing a program stored in the main memory 12 and executes various processes based on the OS. The main control unit 10 executes various processes based on the data stored in the SSD 40, for example. The main control unit 10 includes an AP processing unit 101 and an SSD device driver unit 102.

The AP processing unit 101 is a functional unit that processes an application program executed on the OS. For example, the AP processing unit 101 sets a persistent partition (specific area) in the SSD storage unit 410 of the SSD 40 when the information processing apparatus 1 (own apparatus) reaches EOL and stores important data, which needs to be read a later date, in the persistent partition (specific area).

When the persistent partition (specific area) is set, the AP processing unit 101 stores the information indicating the range of the LBA of the persistent partition (specific area) in the area range storage unit 51. In addition, when the important data is written in the persistent partition (specific area), the AP processing unit 101 recognizes the range of the LBA of the persistent partition (specific area) based on the information stored in the area range storage unit 51.

The AP processing unit 101 accesses the SSD 40 via an SSD device driver unit 102, which will be described later.

The SSD device driver unit 102 is a functional unit that realizes a device driver for accessing the SSD 40. The SSD device driver unit 102 transmits a write request for storing (writing) the data of the designated LBA to the SSD 40 and stores the data in the designated LBA. In addition, the SSD device driver unit 102 transmits a read request for reading the data of the designated LBA to the SSD 40 and reads the data of the designated LBA.

Figure 6:
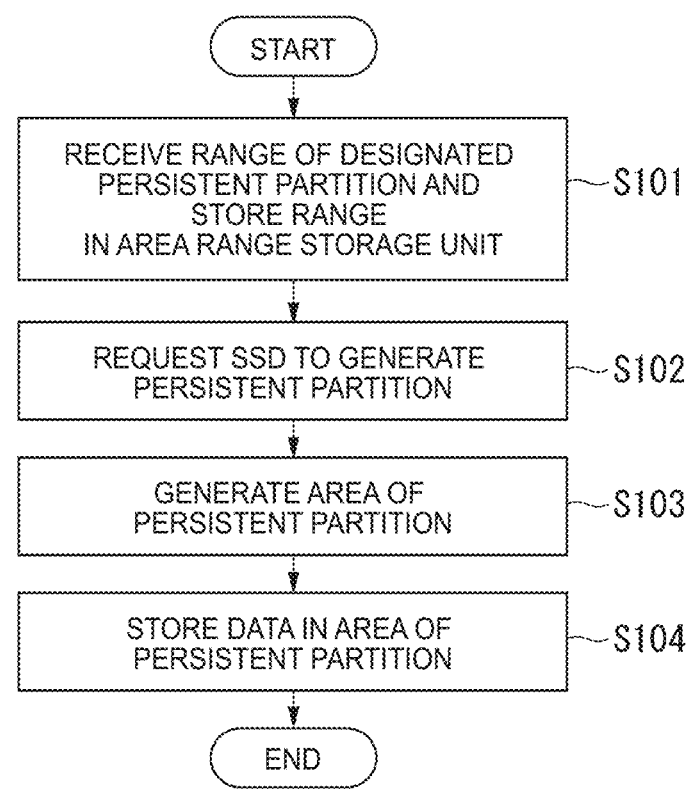
FIG. 6 is a flowchart illustrating an example of a setting process of a persistent partition with the information processing apparatus according to one or more embodiments.

Next, an operation of the information processing apparatus 1 according to one or more embodiments will be described with reference to the drawings. FIG. 6 is a flowchart illustrating an example of a setting process of the persistent partition performed by the information processing apparatus 1 according to one or more embodiments.

As illustrated in FIG. 6, the main control unit 10 of the information processing apparatus 1 first receives a range of the designated persistent partition and stores the range in the area range storage unit 51 (step S101). The AP processing unit 101 of the main control unit 10 stores, for example, the range of the persistent partition received from the input unit 32 in the area range storage unit 51.

Next, the AP processing unit 101 requests the SSD 40 to generate the persistent partition (step S102). The AP processing unit 101 requests the SSD device driver unit 102 to generate the persistent partition, and the SSD device driver unit 102 transmits a generation request for the persistent partition to the SSD 40.

Next, the SSD 40 generates an area of the persistent partition (step S103). The area setting processing unit 421 of the SSD 40 sets the area of the persistent partition in response to the generation request for the persistent partition received from the SSD device driver unit 102. The area setting processing unit 421 stores the range of the LBA of the area of the persistent partition, which is designated through the generation request, in the management information storage unit 411 to generate the area of the persistent partition.

Next, the AP processing unit 101 stores the data in the area of the persistent partition (step S104). The AP processing unit 101 transmits a request for storing the important data to the write processing unit 422 of the SSD 40 via the SSD device driver unit 102 with respect to the LBA of the range of the persistent partition stored in the area range storage unit 51. The write processing unit 422 stores the important data in the area of the persistent partition of the SSD storage unit 410. After the processing of step S104, the AP processing unit 101 ends the processing.

Next, with reference to FIG. 7, the storage process to the SSD 40 performed by the information processing apparatus 1 will be described.

Figure 7:
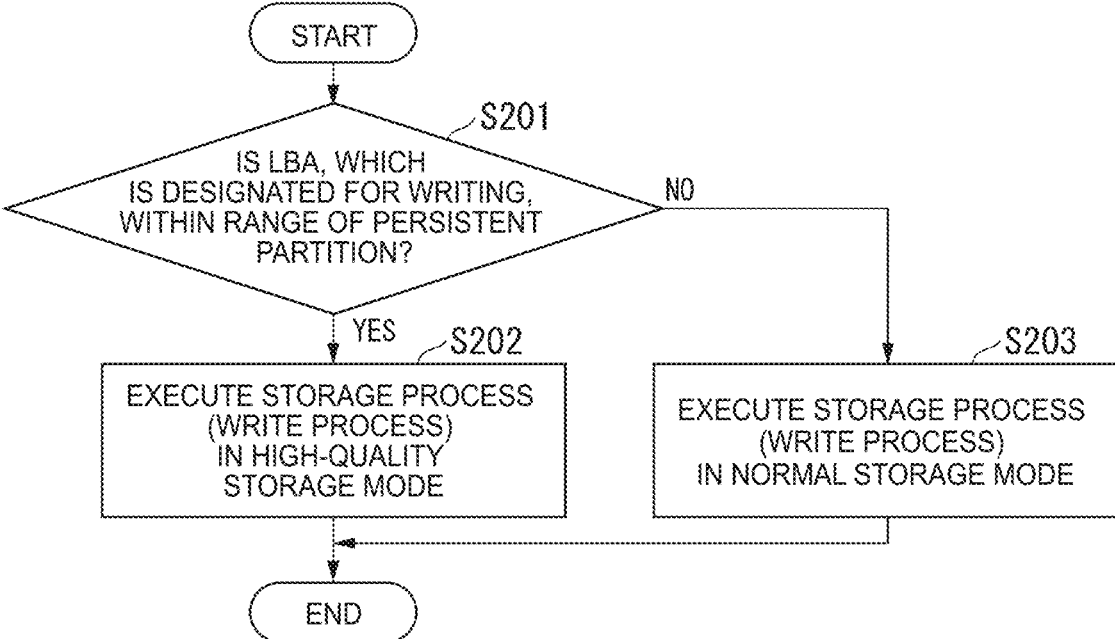
FIG. 7 is a flowchart illustrating an example of a storage process to the SSD with the information processing apparatus according to one or more embodiments.

FIG. 7 is a flowchart illustrating an example of the storage process to the SSD 40 performed by the information processing apparatus 1 according to one or more embodiments.

As illustrated in FIG. 7, the memory control unit 420 of the SSD 40 determines whether or not the LBA, which is designated for writing, (designated LBA) falls within the range of the persistent partition in response to a storage request (write request) from the main control unit 10 (step S201). The write processing unit 422 of the memory control unit 420 determines whether or not the designated LBA falls within the range of the persistent partition based on information indicating the range of the LBA of the persistent partition stored in the management information storage unit 411. When the designated LBA falls within the range of the persistent partition (step S201: YES), the write processing unit 422 proceeds the processing to step S202. In addition, when the designated LBA is outside the range of the persistent partition (step S201: NO), the write processing unit 422 proceeds the processing to step S203.

In step S202, the write processing unit 422 executes the storage process (write process) in the high-quality storage mode. The write processing unit 422 acquires the setting information of the high-quality storage mode from the mode information storage unit 412 and executes the storage process (write process) of the high-quality storage mode as illustrated in FIG. 5, in accordance with the setting information. After the processing of step S202, the write processing unit 422 ends the processing.

In addition, in step S203, the write processing unit 422 executes the storage process (write process) in the normal storage mode. The write processing unit 422 acquires the setting information of the normal storage mode from the mode information storage unit 412 and executes the storage process (write process) of the normal storage mode as illustrated in FIG. 4, in accordance with the setting information. After the processing of step S203, the write processing unit 422 ends the processing.

Next, a description of details of the storage process of the high-quality storage mode, which is the processing of step S202 described above, will be made with reference to FIG. 8.

Figure 8:
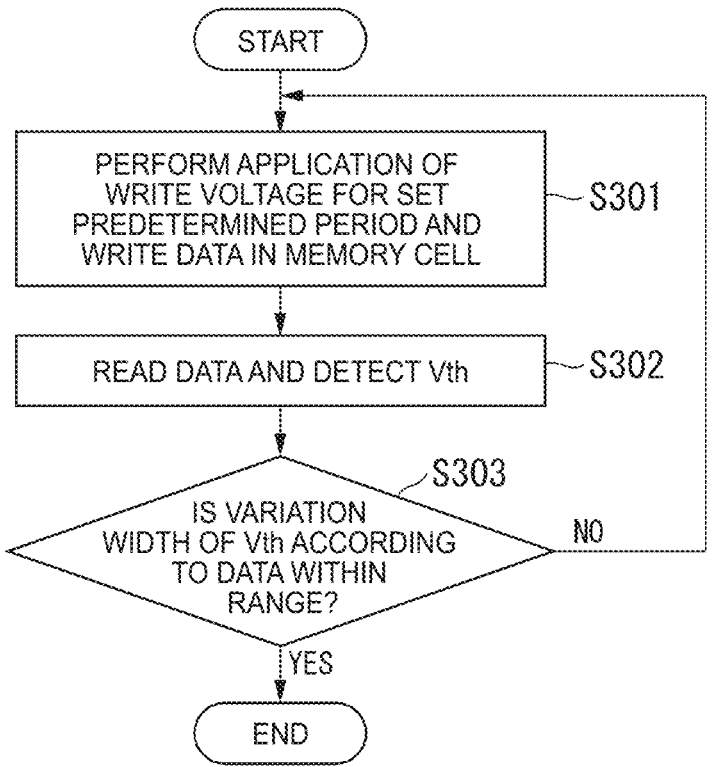
FIG. 8 is a flowchart illustrating an example of a storage process in a high-quality storage mode with the information processing apparatus according to one or more embodiments.

FIG. 8 is a flowchart illustrating an example of the storage process of the high-quality storage mode performed by the information processing apparatus 1 according to one or more embodiments.

As illustrated in FIG. 8, the write processing unit 422 of the memory control unit 420 performs application of the write voltage for the set predetermined period and writes data in the memory cell (step S301). The write processing unit 422 applies the write voltage to the multi-bit cell of the designated LBA for the application period (predetermined period) of the high-quality storage mode stored in the mode information storage unit 412.

Next, the write processing unit 422 reads the data and detects Vth (step S302). The write processing unit 422 executes the read checking and detects the written Vth.

Next, the write processing unit 422 determines whether or not the variation width of Vth according to the data falls within the range (step S303). The write processing unit 422 determines whether or not the detected Vth falls within the range (within an allowable range) of the variation width of Vth according to the write data (checking process). When the detected Vth falls within the variation width of Vth according to the write data (step S303: YES), the write processing unit 422 ends the storage process (write process). In addition, when the detected Vth is not within the variation width of Vth according to the write data (step S303: NO), the write processing unit 422 returns the processing to step S301.

As described above, the write processing unit 422 repeats the processing of step S301 and step S302 until Vth falls within the range of the variation width of Vth according to the write data. As a result, the write processing unit 422 executes writing of the variation width D2 of Vth as illustrated in FIG. 5 described above.

The write processing unit 422 may execute the same processing as that described with reference to FIG. 8 in the normal storage mode by widening the predetermined period and the range of the variation width of Vth more than in the high-quality storage mode. In addition, the write processing unit 422 may execute the storage process (write process) in a preset single write voltage application period in the normal storage mode.

As described above, the information processing apparatus 1 according to one or more embodiments includes the SSD 40 and the main control unit 10. The SSD 40 is configured with a multi-bit cell for storing multi-bit data in one memory cell and includes an electrically rewritable SSD storage unit 410 (non-volatile storage unit). The main control unit 10 executes processing based on the data stored in the SSD 40. The SSD 40 includes the memory control unit 420, which is the memory control unit 420 (storage control unit) that controls access to the SSD storage unit 410, that executes the storage process through which the variation width of Vth (threshold voltage) is changeable when the multi-bit data is stored in the multi-bit cell.

As a result, since the information processing apparatus 1 according to one or more embodiments is capable of executing the storage process through which the variation width of Vth (threshold voltage) is changeable when the multi-bit data is stored in the multi-bit cell, for example, it is possible to switch to a high-quality storage process, and data retention (data retention period) can be extended depending on a storage location. Therefore, the information processing apparatus 1 according to one or more embodiments is capable of reducing the data corruption of the SSD and guaranteeing the reading of the data of the SSD 40 for a certain period, for example, in a state in which the power is not supplied after the EOL.

In the information processing apparatus in the related art, although the management process of checking and correcting the data corruption of the multi-bit cell is periodically executed in a state in which the power is supplied, such management process is not executed in a state in which the power is not supplied. Therefore, in the information processing apparatus in the related art, for example, it is difficult to guarantee the reading of the data of the SSD 40 for a certain period in a state in which the power is not supplied, such as after the EOL. On the other hand, the information processing apparatus 1 according to one or more embodiments is capable of guaranteeing the reading of the data of the SSD 40 for a certain period in a state in which the power is not supplied by switching to the high-quality storage process.

In addition, in one or more embodiments, the memory control unit 420 stores the multi-bit data such that the variation width of Vth is narrower for the persistent partition (specific area), which is set by the main control unit 10, than for the other areas, among the storage areas of the SSD storage unit 410.

As a result, since the information processing apparatus 1 according to one or more embodiments sets the persistent partition (specific area) and makes the variation width of Vth narrower for the persistent partition (specific area) than for other areas, the data corruption of the SSD in the persistent partition (specific area) can be reduced.

In addition, in one or more embodiments, the SSD 40 includes the management information storage unit 411 (position information storage unit) that stores the LBA information (logical position) of the persistent partition in the SSD storage unit 410. The memory control unit 420 determines whether or not the designated LBA is the persistent partition based on the LBA information stored in the management information storage unit 411 when the data is stored at the designated LBA (designated logical position), which is LBA designated by the main control unit 10. When the designated LBA is the persistent partition, the memory control unit 420 stores the data in the designated LBA in the high-quality storage mode in which the variation width of Vth is narrower than in the normal storage mode.

As a result, the information processing apparatus 1 according to one or more embodiments is capable of using the storage process by switching between the storage process in the high-quality storage mode and the storage process in the normal storage mode depending on whether the designated LBA is the persistent partition or not.

In addition, in one or more embodiments, the memory control unit 420 executes, when the designated LBA is not the persistent partition, in the normal storage mode, the storage process in which the variation width of Vth is wider than in the high-quality storage mode, and the storage period, which is a period required for storing data in the multi-bit cell, is shorter than in the high-quality storage mode.

As a result, the information processing apparatus 1 according to one or more embodiments is capable of achieving both the high performance of shortening the storage process period (write period) and a long-term guarantee of data retention (data retention period) due to the narrow variation width of Vth, when using the storage process by switching between the storage process in the normal storage mode and the storage process in the high-quality storage mode.

In addition, in one or more embodiments, the memory control unit 420 executes the repeating process of repeating the application process and the checking process in the high-quality storage mode. In the application process, the memory control unit 420 performs application of a voltage for storing data in the multi-bit cell, for a predetermined period obtained by dividing the application period. In the checking process, the memory control unit 420 checks whether or not Vth falls within the variation width of Vth after the application process is performed. In the repeating process, the memory control unit 420 repeats the application process and the checking process until Vth falls within the variation width of Vth.

As a result, since the information processing apparatus 1 according to one or more embodiments divides the multi-bit cell into a predetermined period to perform application of a voltage for storing the data and repeat while checking Vth, the information processing apparatus 1 is capable of performing the storage process in the high-quality storage mode in which the variation width of Vth is narrowed, by using a simple method.

In addition, in one or more embodiments, the main control unit 10 sets the persistent partition (specific area) in the SSD storage unit 410 when the information processing apparatus 1 (own apparatus) reaches EOL and stores important data, which needs to be read a later date, in the persistent partition.

As a result, when the information processing apparatus 1 according to one or more embodiments reaches EOL, the information processing apparatus 1 sets the persistent partition (specific area) and is capable of extending the data retention (data retention period) of the important data after EOL because the important data is stored in the high-quality storage mode. Therefore, the information processing apparatus 1 according to one or more embodiments is capable of guaranteeing the reading of the important data of the SSD 40 for a certain period.

In addition, a control method according to one or more embodiments is a control method of the information processing apparatus 1 including the SSD 40, which is configured with a multi-bit cell for storing multi-bit data in one memory cell and which includes the electrically rewritable SSD storage unit 410, and the main control unit 10, which executes processing based on the data stored in the SSD 40, the control method includes a memory control step. The memory control step is a step in which the memory control unit 420 of the SSD 40 controls access to the SSD storage unit 410, and the memory control unit 420 of the SSD 40 executes the storage process through which the variation width of Vth is changeable when the multi-bit data is stored in the multi-bit cell.

As a result, the control method according to one or more embodiments has the same effect as the information processing apparatus 1 described above and is capable of reducing the data corruption of the SSD and guaranteeing the reading of the data of the SSD 40 for a certain period, for example, in a state in which the power is not supplied after EOL.

It should be noted that the present invention is not limited to each embodiment described above, and the present invention can be modified without departing from the gist of the present invention.

For example, in the above-described embodiments, although an example has been described in which the information processing apparatus 1 is a laptop personal computer (mobile computer), the present disclosure is not limited to this, and the information processing apparatus 1 may be another information processing apparatus, such as a desktop type personal computer or a tablet terminal device.

In addition, in the embodiments described above, although the example has been described in which the information processing apparatus 1 sets the persistent partition (specific area) in a case of EOL, the present disclosure is not limited to this, and the persistent partition (specific area) may be set as an area for storing important data during normal use.

In addition, in the embodiments described above, although the example has been described in which the information processing apparatus 1 uses two types of storage processes by switching between the normal storage mode and the high-quality storage mode, the information processing apparatus 1 may provide three or more storage modes with a variation width of Vth and use storage processes by switching the storage modes, depending on the purpose.

In addition, in the embodiments described above, although the example is described in which the information processing apparatus 1 sets the persistent partition as an example of a specific area, the present disclosure is not limited to this, and the information processing apparatus 1 may set other areas, such as an area that is not a partition, for example.

In addition, in the embodiments described above, the information processing apparatus 1 (for example, the main control unit 10 or the embedded controller 31) may perform a part of the processing of the memory control unit 420 of the SSD 40.

In addition, in the embodiments described above, although the example has been described in which the multi-bit cell is any of an MLC, a TLC, or a QLC, the present disclosure is not limited to this, and the multi-bit cell may be another multi-bit cell.

In addition, in the embodiments described above, although the information processing apparatus 1 has been described as a personal computer-based configuration example including the embedded controller 31, the present disclosure is not limited to this, and the information processing apparatus 1 may have a configuration that does not include the embedded controller 31. In addition, the OS of the information processing apparatus 1 is not limited to Windows (registered trademark) and may be applied to other OSs, such as Android (registered trademark) and iOS (registered trademark).

Each of the components included in the information processing apparatus 1 and the SSD 40 described above includes a computer system therein. The processing in each of the components included in the information processing apparatus 1 and the SSD 40 described above may be performed by recording a program, which is for realizing the function of each component included in the information processing apparatus 1 and the SSD 40 described above, on a computer-readable recording medium, and reading the program, which is recorded on the recording medium, with the computer system to execute the program. Here, "reading the program, which is recorded on the recording medium, with the computer system to execute the program" includes installing the program in the computer system. The "computer system" herein includes the OS or hardware such as peripheral devices.

In addition, the "computer system" may include a plurality of computer apparatuses connected via a network including a communication line such as the Internet, a WAN, a LAN, or a dedicated line. In addition, the "computer-readable recording medium" is a portable medium such as a flexible disk, a magneto-optical disk, a ROM, or a CD-ROM, and a storage device such as a hard disk built into the computer system. As described above, the recording medium that stores the program may be a non-transitory recording medium such as a CD-ROM.

In addition, the recording medium also includes an internal or external recording medium that can be accessed from a distribution server to distribute the program. It should be noted that a configuration may be used in which the program is divided into a plurality of programs, downloaded at different timings, and then combined with each configuration of the information processing apparatus 1 and the SSD 40, or distribution servers for distributing the respective divided programs may be different. Further, the "computer-readable recording medium" includes a medium, which holds the program for a certain period of time, such as a volatile memory (RAM) inside the computer system that serves as a server or a client when the program is transmitted via the network. The above-described program may be a program for realizing a part of the above-described functions. Further, the program may be a so-called difference file (difference program) in which the above-described functions can be realized in combination with the program already recorded in the computer system.

Further, a part or all of the above-described functions may be realized as an integrated circuit such as a large scale integration (LSI). Each function described above may be individually realized as a processor, and a part or all of the functions may be integrated into a processor. A method of forming an integrated circuit is not limited to the LSI and may be realized by a dedicated circuit or a general-purpose processor. When an integrated circuit technique that replaces an LSI will appear due to advances in semiconductor technique, an integrated circuit based on the technique may be used.

DESCRIPTION OF SYMBOLS

1 information processing apparatus
10 main control unit
11 CPU
12 main memory
13 video subsystem
14 display unit
21 chipset
22 BIOS memory
31 embedded controller (EC)
32 input unit
33 power supply circuit
40 SSD
41 flash memory
42 SSD controller
50 storage unit
51 area range storage unit
101 AP processing unit

102 SSD device driver unit
410 SSD storage unit
411 management information storage unit
412 mode information storage unit
413 data storage unit
420 memory control unit
421 area setting processing unit
422 write processing unit
423 read processing unit

What is claimed is:

1. An information processing apparatus comprising:
a solid state drive (SSD) configured with a multi-bit cell for storing multi-bit data in one memory cell and configured to include an electrically rewritable non-volatile storage unit; and
a main control unit configured to execute processing based on data stored in the SSD, wherein
the SSD includes a storage control unit configured to control access to the non-volatile storage unit, and configured to execute a storage process through which a variation width of a threshold voltage is changeable when the multi-bit data is stored in the multi-bit cell, and
the storage control unit is configured to store the multi-bit data such that the variation width of the threshold voltage is narrower for a specific multi-bit storage area, which is set by the main control unit, than for other multi-bit storage areas, among storage areas of the non-volatile storage unit.

2. The information processing apparatus according to claim 1, wherein
the SSD includes a position information storage unit configured to store logical position information on the specific area in the non-volatile storage unit, and
the storage control unit is configured to determine, when data is stored in a designated logical position that is a logical position designated by the main control unit, whether or not the designated logical position is the specific area based on the logical position information stored in the position information storage unit and store, when the designated logical position is the specific area, the data in the designated logical position with a high-quality storage mode in which the variation width of the threshold voltage is narrower than in a normal storage mode.

3. The information processing apparatus according to claim 2, wherein
the storage control unit is configured to execute, when the designated logical position is not the specific area, in the normal storage mode, the storage process in which the variation width of the threshold voltage is wider than in the high-quality storage mode, and a storage period, which is a period required for storage in the multi-bit cell, is shorter than in the high-quality storage mode.

4. The information processing apparatus according to claim 2, wherein
the storage control unit is configured to execute, in the high-quality storage mode,
an application process of applying a voltage for storing the data to the multi-bit cell for a predetermined period obtained by dividing an application period,
a checking process of checking whether or not the threshold voltage falls within the variation width of the threshold voltage, after the application process is performed, and a repeating process of repeating the application process and the checking process until the threshold voltage falls within the variation width of the threshold voltage.

5. The information processing apparatus according to claim 1, wherein
when the information processing apparatus reaches end of life (EOL), the main control unit is configured to set the specific area in the non-volatile storage unit and store important data, which needs to be read at a later date, in the specific area.

6. A control method of an information processing apparatus including a solid state drive (SSD) configured with a multi-bit cell for storing multi-bit data in one memory cell and configured to include an electrically rewritable non-volatile storage unit, and a main control unit configured to execute processing based on data stored in the SSD, the control method comprising:
a step of causing a storage control unit of the SSD to control access to the non-volatile storage unit, which is a step of executing a storage process through which a variation width of a threshold voltage is changeable when the multi-bit data is stored in the multi-bit cell, wherein
the storage control unit is configured to store the multi-bit data such that the variation width of the threshold voltage is narrower for a specific multi-bit storage area, which is set by the main control unit, than for other multi-bit storage areas, among storage areas of the non-volatile storage unit.

7. An information processing apparatus comprising:
a solid state drive (SSD) configured with a multi-bit cell for storing multi-bit data in one memory cell and configured to include an electrically rewritable non-volatile storage unit; and
a main control unit configured to execute processing based on data stored in the SSD, wherein
the SSD includes a storage control unit configured to control access to the non-volatile storage unit, and configured to execute a storage process through which a variation width of a threshold voltage is changeable when the multi-bit data is stored in the multi-bit cell, and
the storage control unit is configured to store the multi-bit data such that the variation width of the threshold voltage is narrower for a specific area, which is set by the main control unit, than for other areas, among storage areas of the non-volatile storage unit
the SSD includes a position information storage unit configured to store logical position information on the specific area in the non-volatile storage unit,
the storage control unit is configured to determine, when data is stored in a designated logical position that is a logical position designated by the main control unit, whether or not the designated logical position is the specific area based on the logical position information stored in the position information storage unit and store, when the designated logical position is the specific area, the data in the designated logical position with a high-quality storage mode in which the variation width of the threshold voltage is narrower than in a normal storage mode, and
the storage control unit is configured to execute, in the high-quality storage mode,
an application process of applying a voltage for storing the data to the multi-bit cell for a predetermined period obtained by dividing an application period, a checking process of checking whether or not the threshold voltage falls within the variation width of the threshold voltage, after the application process is performed, and a repeating process of repeating the application process and the checking process until the threshold voltage falls within the variation width of the threshold voltage.

\* \* \* \* \*